(12) United States Patent
Lowther et al.

(10) Patent No.: US 7,084,481 B2
(45) Date of Patent: Aug. 1, 2006

(54) SYMMETRIC INDUCTING DEVICE FOR AN INTEGRATED CIRCUIT HAVING A GROUND SHIELD

(75) Inventors: Rex Everett Lowther, Palm Bay, FL (US); William R. Young, Palm Bay, FL (US)

(73) Assignee: Conexant Systems, Inc., Red Bank, NJ (US)

( * ) Notice: Subject to any disclaimer, the term of this patent is extended or adjusted under 35 U.S.C. 154(b) by 190 days.

(21) Appl. No.: 10/855,953

(22) Filed: May 28, 2004

(65) Prior Publication Data

US 2005/0051871 A1    Mar. 10, 2005

Related U.S. Application Data

(62) Division of application No. 10/645,709, filed on Aug. 21, 2003, now Pat. No. 6,900,087, which is a division of application No. 10/039,200, filed on Jan. 4, 2002, now Pat. No. 6,635,949.

(51) Int. Cl.
*H01L 29/00* (2006.01)
(52) U.S. Cl. .................. 257/531; 257/277; 336/200
(58) Field of Classification Search ............... 257/277, 257/351, 495, 528, 531; 336/200, 223, 232
See application file for complete search history.

(56) References Cited

U.S. PATENT DOCUMENTS

| | | | |
|---|---|---|---|
| 5,446,311 A | 8/1995 | Ewen et al. | |
| 5,717,243 A | 2/1998 | Lowther | |
| 5,831,331 A | 11/1998 | Lee | |
| 5,892,425 A | 4/1999 | Kuhn et al. | |
| 6,064,340 A | 5/2000 | Croft et al. | |
| 6,174,803 B1* | 1/2001 | Harvey | 438/638 |
| 6,278,186 B1 | 8/2001 | Lowther et al. | |
| 6,559,751 B1 | 5/2003 | Liu et al. | |
| 6,635,949 B1 | 10/2003 | Lowther et al. | |
| 6,726,805 B1 | 4/2004 | Brown et al. | |
| 6,775,807 B1 | 8/2004 | Lowther et al. | |
| 6,803,849 B1 | 10/2004 | Lowther | |

* cited by examiner

*Primary Examiner*—Phuc T. Dang
(74) *Attorney, Agent, or Firm*—Hunton & Williams LLP

(57) ABSTRACT

The present invention relates to integrated circuits having symmetric inducting devices with a ground shield. In one embodiment, a symmetric inducting device for an integrated circuit comprises a substrate, a main metal layer and a shield. The substrate has a working surface. The main metal layer has at least one pair of current path regions. Each of the current path region pairs is formed in generally a regular polygonal shape that is generally symmetric about a plane of symmetry that is perpendicular to the working surface of the substrate. The shield is patterned into segments that are generally symmetric about the plane of symmetry. Medial portions of at least some segments of the shield are formed generally perpendicular to the plane of symmetry as the medial portions cross the plane of symmetry.

9 Claims, 16 Drawing Sheets

SYMMETRIC INDUCTING DEVICE FOR AN INTEGRATED CIRCUIT HAVING A GROUND SHIELD

CROSS-REFERENCE TO RELATED APPLICATIONS

This application is a divisional application of U.S. application Ser. No. 10/645,709, filed Aug. 21, 2003 and titled "Symmetric Inducting Device For An Integrated Circuit Having A Ground Shield," now U.S. Pat. No. 6,900,087, which is a divisional application of U.S. application Ser. No. 10/039,200, filed Jan. 4, 2002 and titled "Symmetric Inducting Device For An Integrated Circuit Having A Ground Shield.", now U.S. Pat. No. 6,635,949.

TECHNICAL FIELD

The present invention relates generally to symmetric inducting devices incorporated in integrated circuits and in particular the present invention relates to an integrated circuit having symmetric inducting device with a ground shield.

BACKGROUND

Integrated circuits incorporate complex electrical components formed in semiconductor material into a single circuit. Generally, an integrated circuit comprises a substrate upon which a variety of circuit components are formed and connected to form a circuit. Integrated circuits are made of semiconductor material. Semiconductor material is material that has a resistance that lies between that of a conductor and an insulator. The resistance of semiconductor material can vary by many orders-of-magnitude depending on the concentration of impurities or dopants. Semiconductor material is used to make electrical devices that exploit its resistive properties.

It is desired to design integrated circuits in which electrical components and circuits within the integrated circuit do not interfere with each other. One method of accomplishing this is by including differential circuits. A differential circuit is a circuit that is really two circuits with opposite voltages and currents. That is, a differential circuit comprises a first circuit that produces desired voltages and currents and a second circuit that is identical to the first circuit that produces opposite voltages and currents. The opposite voltages and currents work to cancel out parasitics that naturally occur because of the voltages and currents and helps isolate the circuit from other circuits in the integrated circuit. Further discussion on parasitics can be found in U.S. Pat. No. 5,717,243, which is incorporated herein by reference.

Symmetric inducting devices are useful in differential circuits. Moreover, it is desired in the art to have a symmetric inducting device that has less resistive loss without introducing other parasitics.

For the reasons stated above and for other reasons stated below which will become apparent to those skilled in the art upon reading and understanding the present specification, there is a need in the art for an integrated circuit with a symmetric inductor that has reduced resistive loss with low parasitic characteristics.

SUMMARY

The above-mentioned problems with symmetric inductors in integrated circuits and other problems are addressed by the present invention and will be understood by reading and studying the following specification.

In one embodiment, a symmetric inducting device for an integrated circuit is disclosed. The symmetric inducting device comprises a substrate, a main metal layer and a shield. The substrate has a working surface and a second surface that is opposite the working surface. The main metal layer has at least one pair of current path regions. Each of the current path region pairs is formed in generally a regular polygonal shape. Moreover, each current path region pair is generally symmetric about a plane of symmetry that is perpendicular to the working surface of the substrate such that each current path region pair has one current path region on one side of the plane of symmetry and another current path region on the other side of the plane of symmetry. The shield is positioned between the second surface of the substrate and the main metal layer. The shield is patterned into segments. The segments of shield are generally symmetric about the plane of symmetry. In addition, medial portions of at least some segments of the shield are formed generally perpendicular to the plane of symmetry as the medial portions cross the plane of symmetry. The shield is more conductive than regions directly adjacent the shield.

In another embodiment, a symmetric transformer for an integrated circuit comprises a substrate, a main metal layer and a shield. The substrate has a working surface and a second surface that is opposite the working surface. The main metal layer has at least one pair of current path regions. Each of the current path region pairs is formed in generally a regular polygonal shape. Moreover, each current path region pair is generally symmetric about a plane of symmetry that is perpendicular to the working surface of the substrate such that each current path region pair has one current path region on one side of the plane of symmetry and another current path region on the other side of the plane of symmetry. The shield is positioned between the second surface of the substrate and the main metal layer. The shield is patterned into segments. The segments of shield are generally symmetric about the plane of symmetry. Medial portions of most segments of the shield are formed generally perpendicular to the plane of symmetry as the medial portions cross the plane of symmetry. In addition, the shield is more conductive than regions directly adjacent the shield.

In another embodiment, a symmetric inducting device for an integrated circuit is disclosed. The symmetric inducting device includes a substrate, a main metal layer and at least one current router. The substrate has a working surface and a second surface opposite the working surface. The main metal layer is positioned a predetermined distance from the working surface of the substrate. The main metal layer having at least one pair of current path regions. Each current path region pair is formed in generally a regular polygonal shape. Moreover, each current path region pair is generally symmetric about a plane of symmetry that is perpendicular to the working surface of the substrate such that each current path region pair has one current path region on one side of the plane of symmetry and another current path region on the other side of the plane of symmetry. The at least one current router is used to selectively route current from one pair of current path regions to another pair of current path regions. Each current router has an overpass and an underpass, wherein a width of the overpass is narrower than a width of the underpass.

In another embodiment, an inductor for an integrated circuit is disclosed. The inductor includes a substrate, one or more pairs of current path regions, one or more current routers and a conductive shield. The substrate has a working surface and a second surface opposite the working surface. The one or more pairs of current path regions are formed in a first metal layer. Each pair of current path regions is generally symmetric about a plane of symmetry such that each current path region pair has one current path region on one side of the plane of symmetry and another current path region on the other side of the plane of symmetry. Moreover, each pair of current path regions is formed in a generally regular polygonal shape. The one or more current routers are selectively coupled to route current from current path regions in a pair of current path regions to current path regions in other pairs of current path regions. Each current router has an overpass and an underpass. The conductive shield layer is positioned between the second surface of the substrate and the first metal layer. The shield layer is patterned into segments to decrease image currents. The segments of the shield layer are generally symmetric about the plane of symmetry, wherein a portion of most segments of shield adjacent the plane of symmetry are perpendicular to the plane of symmetry.

In another embodiment, a symmetric inducting device for an integrated circuit is disclosed. The symmetric inducting device includes a substrate, a main metal layer, a shield and a conducting halo. The substrate has a working surface and a second surface that is opposite the working surface. The main metal layer has at least one pair of current path regions. Each current path region pair is formed in generally a regular polygonal shape. Moreover, each current path region pair is generally symmetric about a plane of symmetry that is perpendicular to the working surface of the substrate such that each current path region pair has one current path region on one side of the plane of symmetry and another current path region on the other side of the plane of symmetry. The shield is positioned between the second surface of the substrate and the main metal layer. The shield is patterned into segments. The segments of shield are generally symmetric about the plane of symmetry. Moreover, the shield is more conductive than regions directly adjacent the shield. The conducting halo extends around an outer perimeter of the shield. The halo is further electrically connected to each section of shield. Moreover, the halo has at least one gap and is symmetric about the plane of symmetry. Each section of shield is electrically connected to the halo.

In another embodiment, an inducting device for an integrated circuit is disclosed. The inducting device includes a substrate, a main metal layer, a shield layer, at least one current router and one or more capacitor compensation sections for each current router. The substrate has a working surface and a second surface opposite the working surface. The main metal layer is formed a select distance from the working surface of the substrate. The main metal layer has one or more pairs of current path regions formed therein. The shield layer is positioned between the second surface of the substrate and the main metal layer. The shield layer is more conductive than regions directly adjacent the shield layer. The at least one current router couples a current path region in one pair of current path regions to a current path region in another pair of current path regions. Each current router has an overpass and an underpass. Each capacitor compensation section is electrically connected to a current path region that is coupled to an overpass of an associated current router, wherein each capacitor compensation section approximates parasitic capacitance of an underpass of the associated current router to the shield layer.

In another embodiment, a current router for an inducting device in an integrated circuit is disclosed. The current router comprises one or more overpasses to electrically connect select current path regions of the inducting device. The one or more overpasses are made from a conductive layer having a first sheet resistance. Each overpass has a first width. The current router also has one or more underpasses to electrically connect different select current path regions. The one or more underpasses are made from a conducting layer having a second different sheet resistance. Each underpass has a second different width, wherein the resistance in each overpass is approximately equal to the resistance in each associated underpass.

In another embodiment, a patterned shield layer having a plurality of segments of shield for an inducting device in an integrated circuit is disclosed. The patterned shield layer includes a plurality of conductive straps. Each conductive strap is electrically connected to a selected segment of shield to provide an alternative path of reduced resistance for the associated segment of shield.

In another embodiment, a method of forming an inductive device in an integrated circuit. The method comprising forming a shield layer. Patterning the shield layer into sections of shield that are generally symmetric to a plane of symmetry, wherein portions of some of the sections of shield are patterned perpendicular to the plane of symmetry as they cross the plane of symmetry. Forming a layer of dielectric overlaying the sections of shield. Depositing a first layer of metal overlaying the dielectric layer. Patterning the first layer of metal to from one or more pairs of current path regions that are generally symmetric about the plan of symmetry such that each current path region pair has one current path region on one side of the plane of symmetry and another current path region on the other side of the plane of symmetry.

In another embodiment, a method of forming a symmetric inducting device for an integrated circuit is disclosed. The method comprising patterning one or more pairs of current path regions in a main metal layer that overlays a working surface of a substrate of an integrated circuit, wherein each pair of current path regions are patterned to be generally symmetric about a plane of symmetry that is perpendicular to the working surface of the substrate. Forming current routers having an overpass and an underpass to selectively couple one current path region in a pair of current path regions to another current path region in another pair of current path regions, wherein a width of the overpass is formed less than the width of the underpass to approximate resistances through the overpass and the underpass.

In another embodiment, a method of forming a symmetric inducting device for an integrated circuit is disclosed. The method comprises, forming a shield layer and patterning the shield layer to form sections of shield that are generally symmetric to a plane of symmetry, wherein at least a mid portion of most sections of shield are perpendicular to the plane of symmetry. Metal straps are formed from at least one interior metal layer, wherein the at least one interior metal layer is formed a select distance from the sections of shield. Termination ends of each of the metal straps are coupled to an associated select section of shield, wherein each strap extends along the mid portion of an associated select section of shield. The method further includes forming a plurality of current path regions from a main metal layer. The at least one interior metal layer is positioned closer to the shield layer than to the main metal layer. Moreover, the plurality of the current path regions are generally symmetric to the plane of symmetry.

In another embodiment, a method of forming an inductive device in an integrated circuit is disclosed. The method comprising, forming a shield layer. Patterning the shield layer into segments of shield that are symmetric about a plane of symmetry. Forming a conductive halo a predetermined distance from shield layer, wherein the halo is formed to extend around an outer perimeter of the segments of shield. Coupling the conductive halo to each of the sections of shield. Patterning at least one gap in the conducting halo, wherein the conducting halo is symmetric about the plane of symmetry. Forming a main metal layer, the halo is positioned between the main metal layer and the shield layer. Patterning the main metal layer to form at least one pair of generally regular polygonal current path regions wherein the at least one pair of current path regions are generally symmetric about the plane of symmetry.

In another embodiment, a method of forming a current router to coupled select current path regions in an integrated circuit is disclosed. The method comprising forming a first conductive layer having a first sheet resistance. Patterning the first conductive layer to form one or more underpasses having a first width. Forming a second conductive layer having a second different sheet resistance a select distance from the first conductive layer. Patterning the second conductive layer to form one or more overpasses having a second different width, wherein the resistance in each overpass is generally equal to the resistance in an associated underpass.

In another embodiment, a method of forming an inducting device, the method comprising forming a shield layer. Forming a main metal layer a select distance from the shield layer. Patterning the main metal layer into one or more current path regions. Forming one or more current routers to couple current path regions to each other, wherein each current router having an overpass and an underpass. Forming one or more capacitor compensation sections for each current router. Coupling each capacitor compensation section to an overpass of an associated current router to approximate parasitic capacitance of an underpass of the associated current router to the shield.

BRIEF DESCRIPTION OF THE DRAWINGS

The present invention can be more easily understood and further advantages and uses thereof more readily apparent, when considered in view of the description of the preferred embodiments and the following figures in which.

In accordance with common practice, the various described features are not drawn to scale but are drawn to emphasize specific features relevant to the present invention. Reference characters denote like elements throughout Figures and text.

DETAILED DESCRIPTION

In the following detailed description of the preferred embodiments, reference is made to the accompanying drawings, which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims and equivalents thereof.

Embodiments of the present invention relate to integrated circuits that include symmetric inducting devices with reduced resistance and parasitics. In the following description, the term substrate is used to refer generally to any structure on which integrated circuits are formed, and also to such structures during various stages of integrated circuit fabrication. This term includes doped and undoped semiconductors, epitaxial layers of a semiconductor on a supporting semiconductor or insulating material, combinations of such layers, as well as other such structures that are known in the art. Terms of relative position as used in this application are defined based on a plane parallel to the conventional plane or working surface of a wafer or substrate, regardless of the orientation of the wafer or substrate. The term "horizontal plane" or "lateral plane" as used in this application is defined as a plane parallel to the conventional plane or working surface of a wafer or substrate, regardless of the orientation of the wafer or substrate. The term "vertical" refers to a direction perpendicular to the horizontal. Terms, such as "on", "side" (as in "sidewall"), "higher", "lower", "over," "top" and "under" are defined with respect to the conventional plane or working surface being on the top surface of the wafer or substrate, regardless of the orientation of the wafer or substrate.

Figure 1:
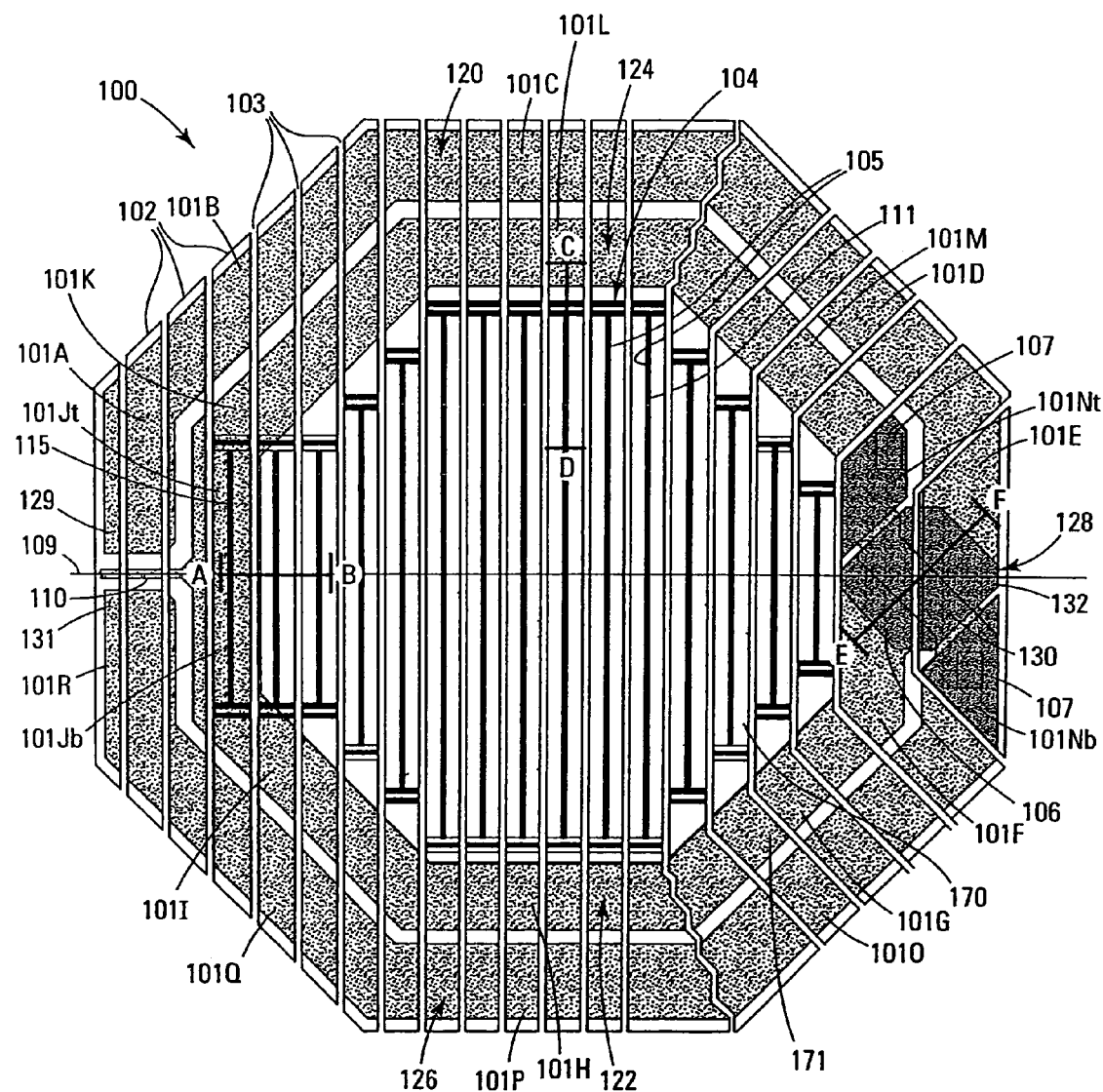
FIG. 1 is a top-view of a symmetric center-tapped inductor of one embodiment of the present invention.

The present invention can be applied to symmetric inducting devices having inductive sets of rings that are typically formed in a metal layer of an integrated circuit. Examples of this type of device are 2-lead symmetric inductors, 3-lead symmetric center-tapped inductors, 4-lead symmetric transformers, etc. Referring to FIG. 1, a center-tapped inductor 100 formed in an integrated circuit, of one embodiment of the present invention, is illustrated. As illustrated, the center-tapped inductor 100 has a first, second, third and fourth current path regions 120, 122, 124 and 126 respectfully. The current path regions 120, 122, 124 and 126 are formed generally in pairs of regular polygonal shapes as illustrated in FIG. 1. In particular, embodiments of the present invention include pairs of current path regions in the form of regular polygonal shapes such as square, octagonal, hexagonal and circular.

Figure 1A:
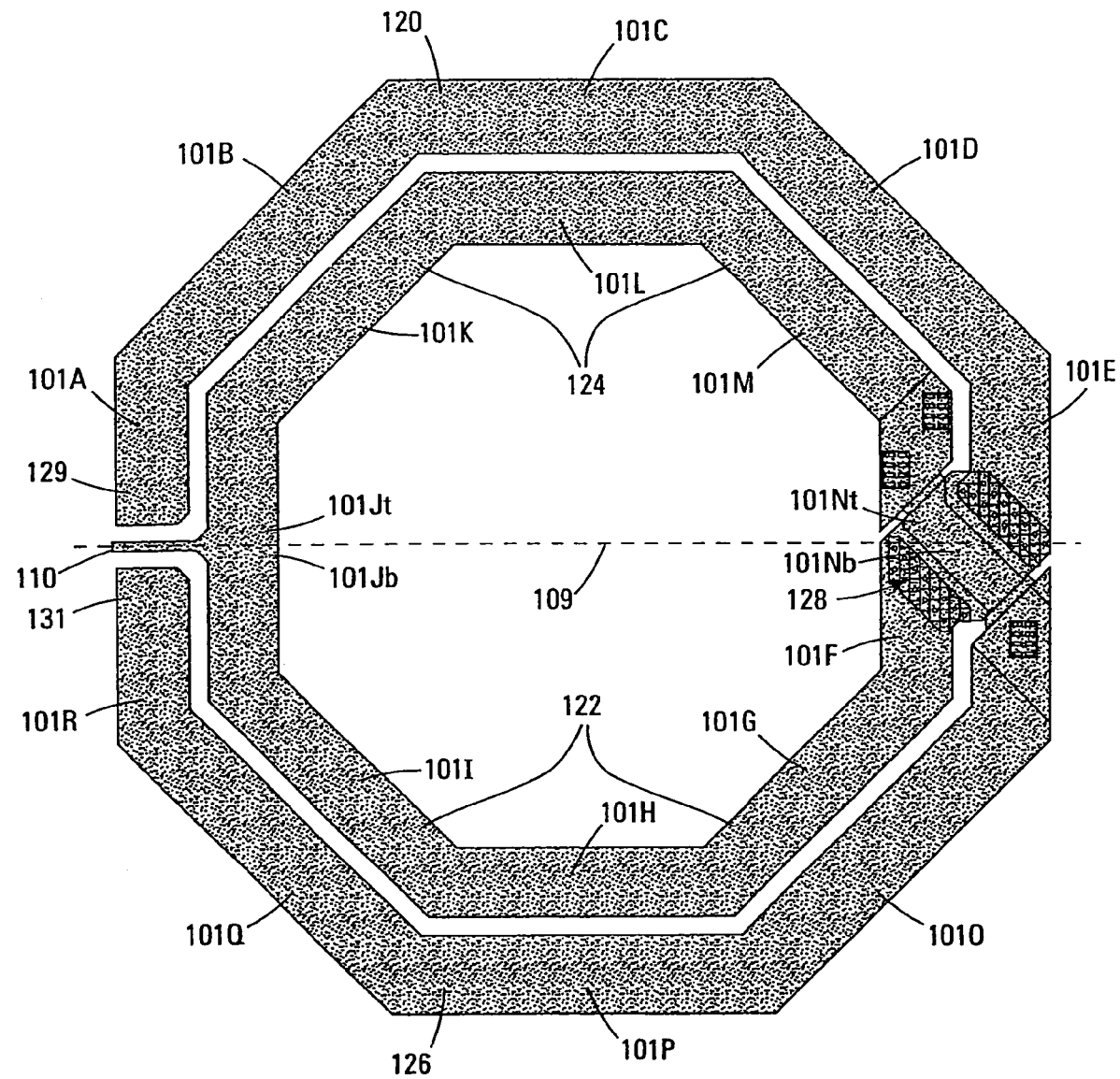
FIG. 1A is a top view of current path regions of one embodiment of the present invention.

In one embodiment, the first, second, third and fourth current path regions 120, 122, 124 and 126 are patterned from a layer of metal. An illustration of the current path regions 120, 122, 124 and 126 are illustrated in FIG. 1A. In operation, the current path starts at a positive lead 129 (first lead 129) of the first current path region 120. The current then flows along the first current path region 120, the current path designated by 101A, 101B, 101C, 101D and 101E. The current then enters a current router 128 that directs the current to the second current path region 122. The current then flows along the second current path region 122, the current path designated by 101F, 101G 101H, 101I and 101Jb. This is the halfway point of the current path and should be very close to AC ground.

The halfway point of the current path is also the point where the current passes a plane of symmetry 109 of the symmetric center-tapped inductor 100. The plane of symmetry 109 is a plane that extends perpendicular from a working surface of the symmetric center-tapped inductor 100 and is represented by the line 109 in the plan view (top view) of FIGS. 1 and 1A. A center lead 110 is attached at the plane of symmetry. In one embodiment, the center lead 110 is coupled to an external AC ground. The current path continues by flowing through the third current path region 124, the current path designated by 101Jt, 101K, 101L, 101M and 101Nt. The current router 128 then directs the current to the fourth current path region 126. The current then flows through the fourth current path region 126, the current path designated by 101Nb, 101O, 101P, 101Q and 101R. The current then enters a negative lead 131 (second lead 131).

Although lead 129 and lead 131 of FIGS. 1 and 1A are respectfully referred to as the positive and negative lead, it will be understood in the art that since we are dealing with an AC current, the actual voltage on each of the leads 129 and 131 will alternate between positive and negative and that the designation of lead 129 as positive lead 129 and lead 131 as negative lead 131 is for illustration purposes only.

The center lead 110 can be thought of as a center-tap to an inductor. In fact, the symmetric center-tapped inductor 100 of the present invention can be referred to as a center-tap to an inductor 100. Advantageously, differential symmetric center-tapped inductor 100 produces more inductance for given parasitic resistance and capacitance than separate inductor circuits. In addition, differential symmetric center-tap inductor 100 is better isolated from a substrate upon which it is formed. For example, if only one half of symmetric center-tapped inductor 100 was used, an AC voltage would be capacitively generated into the substrate which would couple to other circuits or generate losses that will effectively increase resistance and reduce the quality factor (Q) of the inductor. It could also increase phase noise. However, with differential symmetric center-tapped inductor 100 these problems are reduced because as one of the circuits of symmetric center-tapped inductor pushes negative voltage down to the substrate the other of the circuits pulls an opposite positive voltage up from the substrate. Accordingly, the voltages cancel out. In fact, the (AC) voltages cancel to approximately zero right along the plane of symmetry. Therefore, the plane of symmetry has a voltage that is always at approximately AC ground, and the terms "plane of symmetry" and "AC ground" can be used interchangeably.

Figure 1B:
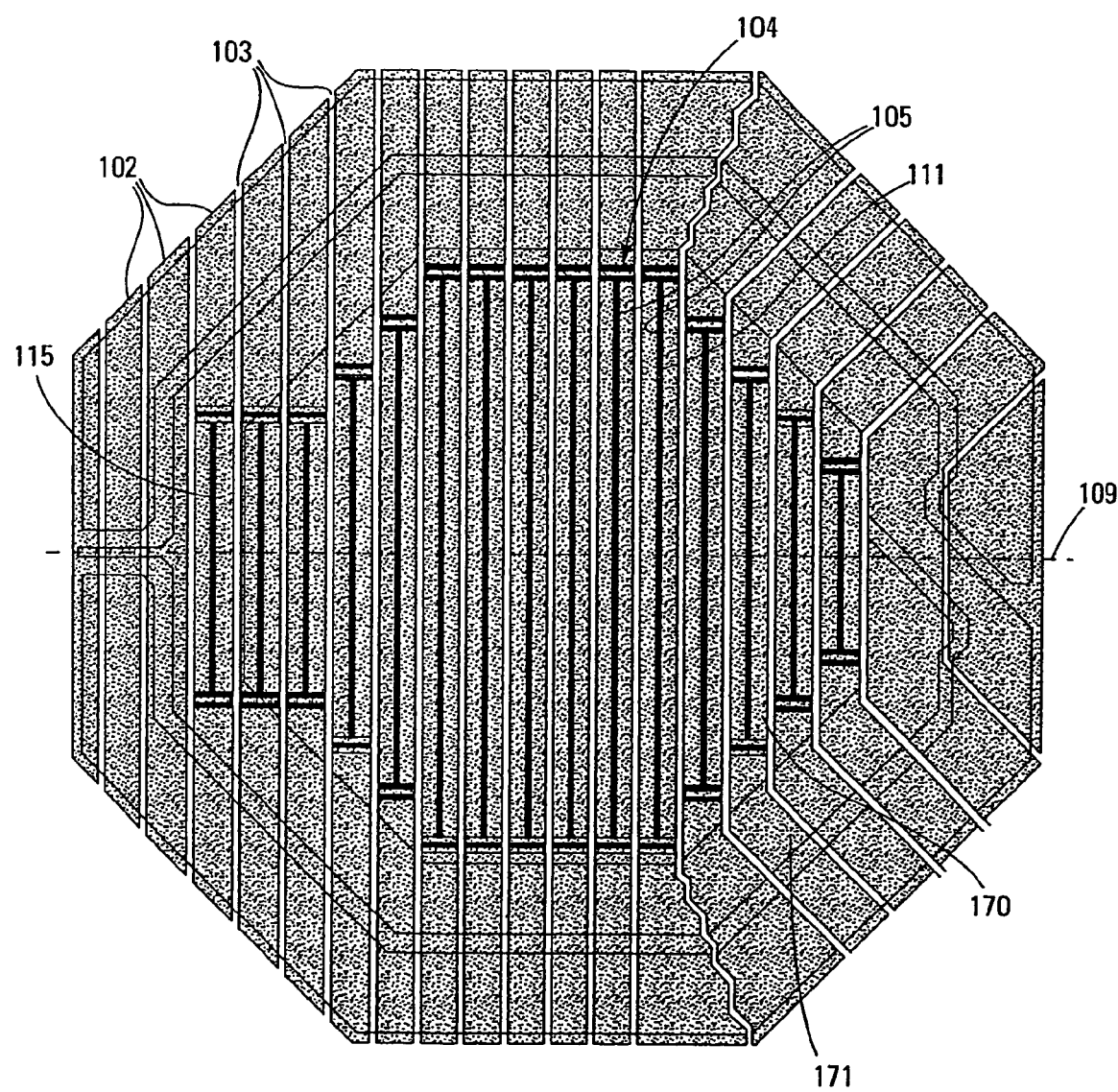
FIG. 1B is a top view of a symmetric center-tapped inductor of one embodiment of the present invention illustrating shield and strap layers.

The symmetric center-tapped inductor 100 also has a ground shield 102, as illustrated in FIG. 1. The shield 102 helps cancel out the voltages and is formed in a layer below the symmetric center-tapped inductor 100. In particular, the shield 102 reduces resistance and parasitics to provide a high Q factor. In addition, the shield 102 helps provide isolation from the rest of the circuits in the integrated circuit. The shield 102 is a layer of material that is more conductive than any of the material directly adjacent it. The ground shield 102 of the symmetric center-tapped inductor of FIG. 1 is also illustrated in FIG. 1B.

In order to reduce eddy or image currents in the shield 102, the shield is patterned with shield gaps 103 to form sections of shield 102. Without the gaps 103, the conductive shield 102 would allow image currents to flow in the shield and because these image currents are lossy, the Q of the symmetric center-tapped inductor would be destroyed. As illustrated in FIGS. 1 and 1B, in this embodiment, some of the gaps 103 are positioned parallel with each other and perpendicular to the plane of symmetry 109. The remaining gaps 103 have portions that are parallel to each other and perpendicular to the plane of symmetry 109. End portions of these gaps 103 extended at predetermined angles from the portions that are perpendicular to the plane of symmetry 109. Stated another way, some segments of shield 102 have medial portions 170 that are perpendicular to the plane of symmetry 109 as they cross the plane of symmetry and end portions 171 that extend at predetermined angles from the medial portion 170. This is illustrated in FIGS. 1 and 1B. As a result of this arrangement, the sections of shield 102 are bilaterally symmetric about the plane of symmetry 109. Moreover, in this arrangement, very short current paths to the A.C. ground (plane of Symmetry) are achieved in each segment of shield 102. Of course the shortest path to the AC ground (or the plane of symmetry 109) would be provided by a series of vertical shield segments. However, that does not necessarily result in the lowest resistance. Referring to the right side of FIG. 1, charged pushed down by the positive section 101D of current region 120 first travels inwardly past negative section 101M of current region 124 where some of the change gets canceled out. From this point, there is less total current than has to travel to the plane of symmetry, and this further reduces the total resistive loss in the shield 102. By adding the angles to the shield segments 102 (or to the shield patterning), the coupling between positive region 101D and negative region 101M is optimized so that the overall shield current is minimized.

The shield 102 helps the current get from the positive side to the negative side. For example, referring back to FIG. 1, if a positive voltage is applied to main metal layer lead 129 of the symmetric center-tapped inductor 100, a charge is pushed down capacitively into the shield 102. The charge will travel in the shield until it gets to the opposite side of the symmetric center-tapped inductor 100, which in this case is under lead 131. At this point, the charge will be pulled back up to the main metal layer at lead 131. Similarly, if a positive voltage is positioned at 101C, charge will be capacitively pushed down to the shield 102. The charge will then travel in the shield 102 until it reaches the opposite side of the symmetric center-tapped inductor 100, which in this case is under 101P. At this point, the charge will be pulled back up to the main metal layer in current path region 126.

Figure 1C:
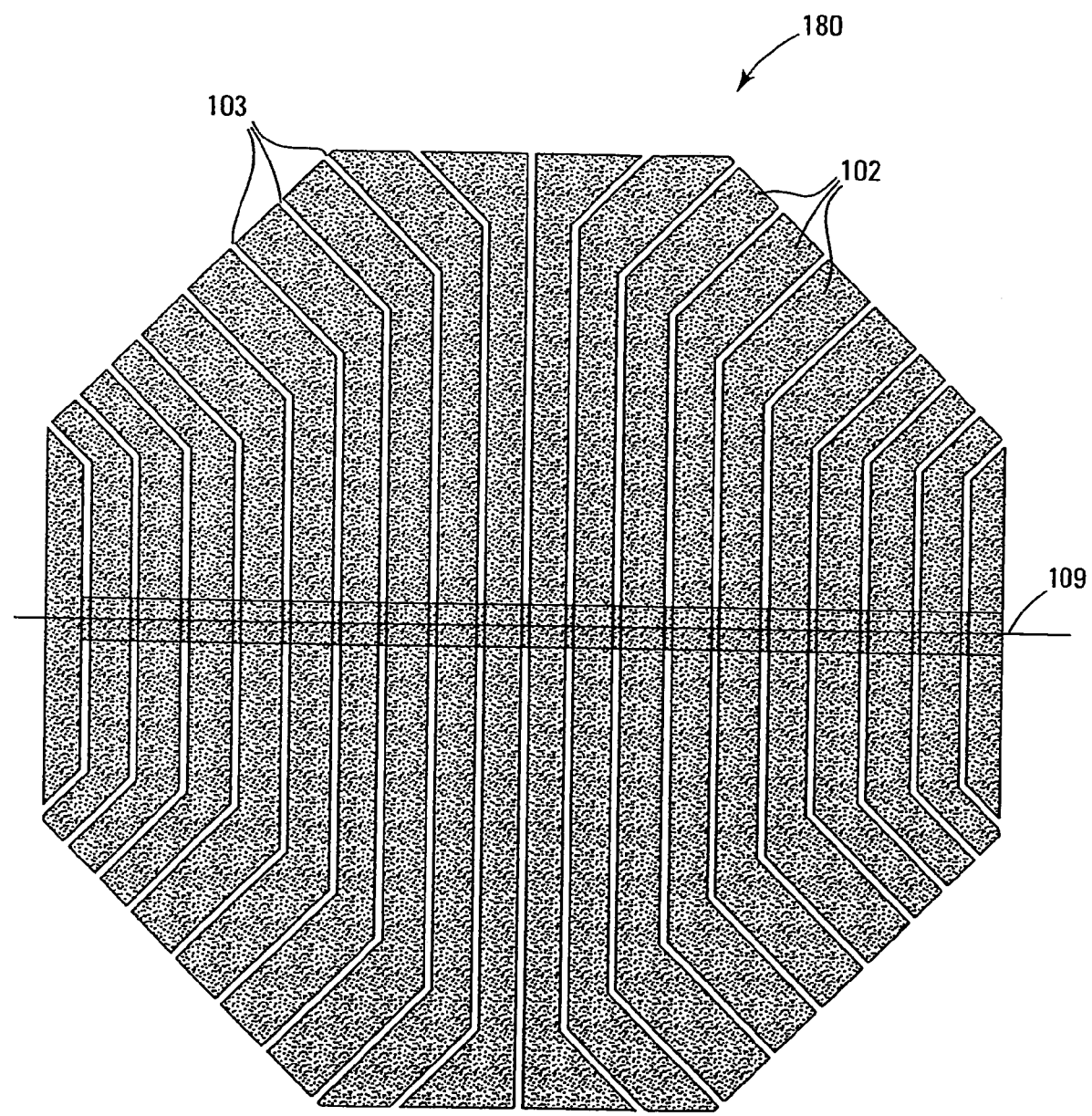
FIG. 1C is a top-view of another embodiment of a shield layer of the present invention.

Another embodiment of a shield 180 is illustrated in FIG. 1C. As in the previous embodiment, sections of shield are patterned by gaps 103. Moreover, as illustrated, portions of some of the sections of shield 103 are perpendicular to the plane of symmetry 109 as the portions cross the plane of symmetry 109. This design allows for a very low resistance path to AC ground (the plan of symmetry 109).

Referring back to FIG. 1, in the embodiment illustrated, conductive straps 105 are coupled (electrically connected) to the shield 102 to further reduce the resistance of the shield 102. The conductive straps 105 are selectively positioned perpendicular to the plane of symmetry 109 and are coupled to an associated segment of shield 102. In this embodiment, a charge may either travel through the shield 102 or it may travel through an associated strap 105 for a distance in reaching the opposite side of the symmetric center-tapped inductor 100. In one embodiment, the terminal ends 104 of each of the conductive straps 105, which are coupled to an associated segment of shield 102, are wider than a medial portion 111 of the strap 105. This provide a greater area to couple to the respective shield 102 segments while limiting the conduction of the straps 105 through the medial portion 111 by limiting its width. The reduced widths of the medial portion 111 of the straps 105 ensure that parasitic eddy currents in the straps 105 are negligibly small. In embodiments of the present invention, the straps 105 are made from a conductive layer that is more conductive than the segments of shield 102. In one embodiment, the straps 105 are made of metal and can be referred to as metal straps 105. Moreover, in yet another embodiment, each strap 105 is formed closer to its associated shield 102 segment than a main metal layer in which the current path regions 120, 122, 124 and 126 are formed.

In one embodiment, straps 105 are not positioned directly under current path regions 120, 122, 124 and 126 to avoid the addition of capacitance. However, in the embodiment of FIG. 1, one strap 115 is located under the second and third current path regions 122 and 124 adjacent the line of symmetry. This strap 115 helps reduce the resistance in the shield 102 at this location. Moreover, since the strap 115 and the shield at this location is essentially at AC ground the additional capacitance formed by the addition of strap 115 does not have a significant effect on device performance.

Figure 1D:
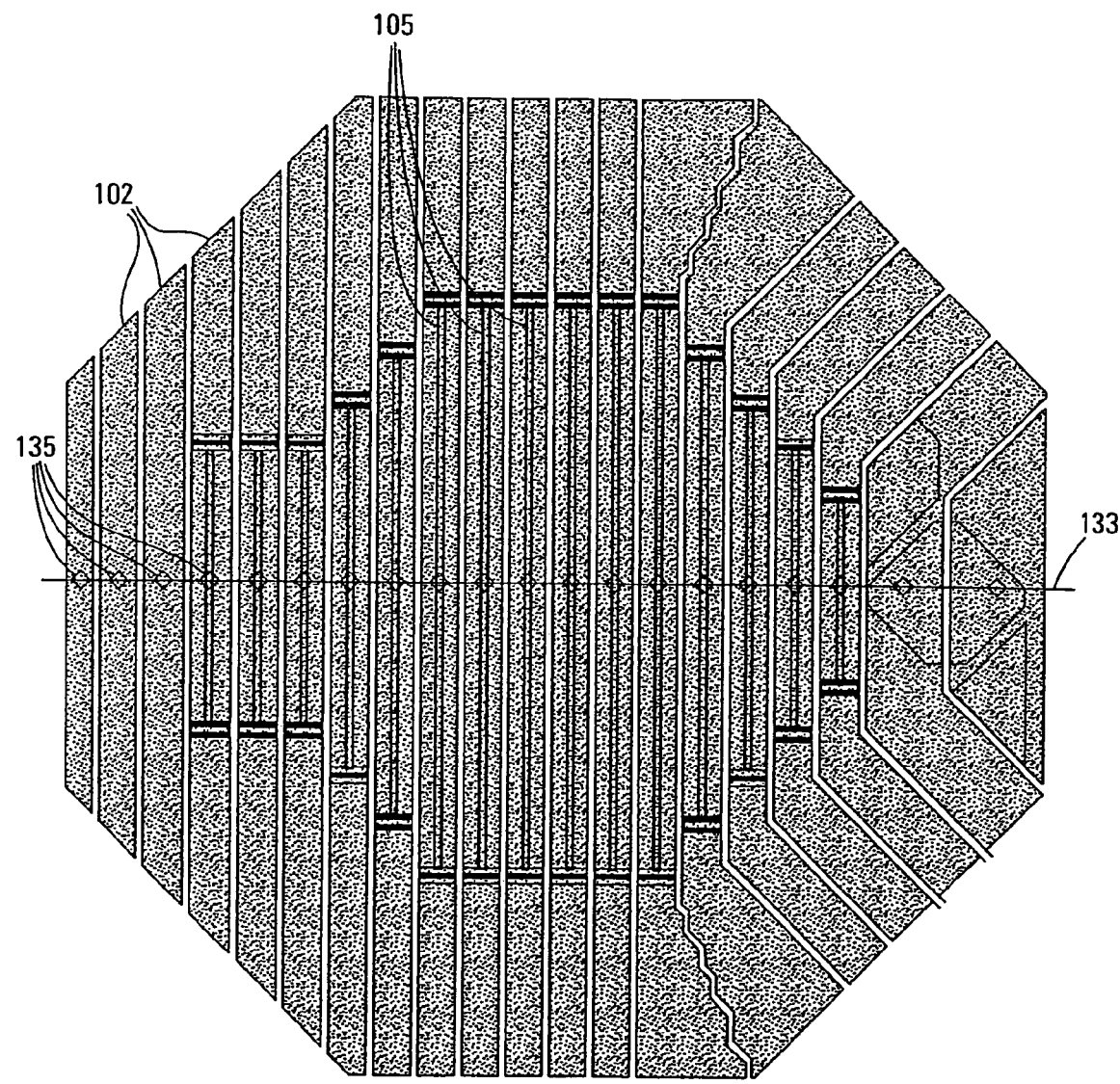
FIG. 1D is a top-view of yet another embodiment of a shield layer having straps of one embodiment of the present invention.

Since the AC voltage is approximately at zero at the line of symmetry 109 it is unnecessary to hook the shield 102 to an external AC ground. An advantage to this embodiment is that the shield 102 does not have to be coupled to any other layer of conductive material. In other circuits however, there may be an advantage to having the shield 102 coupled to AC ground. Therefore, in another embodiment, a conductive path 133 or ground line 133 runs along the plane of symmetry 109 and is coupled (electrically connected) to, at least most, of the segments of the shield 102. This is illustrated in FIG. 1D. As illustrated in FIG. 1D, the sections of shield 102 are coupled to the conductive path 133 with connections or vias 135. The conductive path 133 runs along the plane of symmetry. Moreover in one embodiment, the conductive straps 105 are also coupled (electrically connected) to the conductive path 133. In one embodiment, the conductive path 133 is only connected to the shield 102. In another embodiment, the conductive path 133 is also coupled to center-tap 110 which is formed from the current path regions of the main metal layer as illustrated in FIG. 1A. In yet another embodiment, conductive path 133 is coupled to a separate external AC ground. In one embodiment, the conductive path 133 is made from a metal layer and can be referred to as a metal line 133. In still another embodiment, the conductive path 133 is made from the same metal layer the shield 102 is made from.

Figure 2:
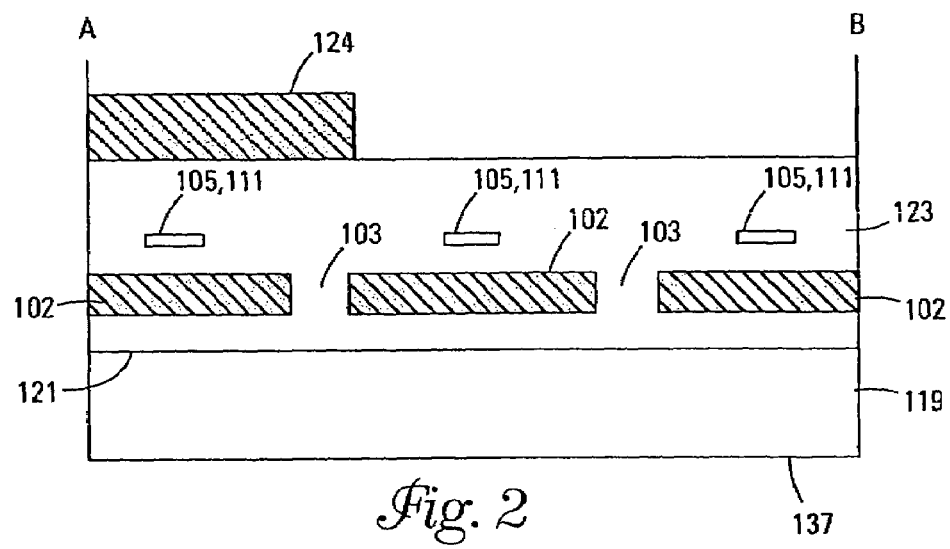
FIG. 2 is a cross-sectional cut-out view of an area defined by line A_B of a symmetric center-tapped inductor of one embodiment of the present invention.
Figure 3:
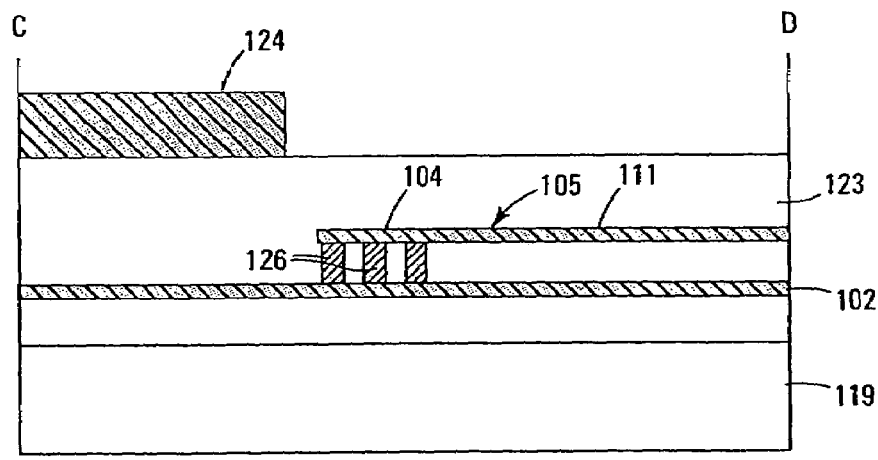
FIG. 3 is a cut-out view of a cross-sectional area defined by line C_D of a symmetric center-tapped inductor of one embodiment of the present invention.
Figure 4:
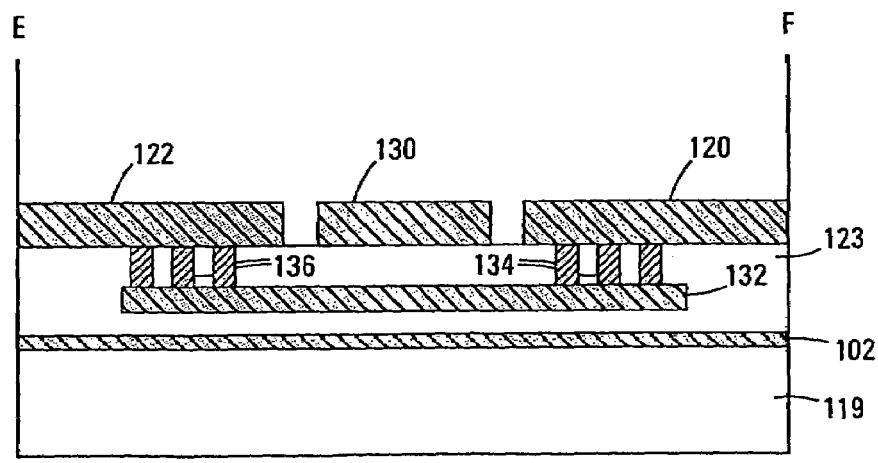
FIG. 4 is cut-out view of a cross-sectional area defined by line E_F of a symmetric center-tapped inductor of one embodiment of the present invention.

To provide a better understanding of how the present invention is constructed, cross-sectional views of lines A_B, C_D and F_E of FIG. 1, are illustrated in FIGS. 2–4 respectfully. Referring to FIG. 2, a cross-sectional view of line A_B is illustrated. As illustrated in this view, the symmetric center-tapped inductor 100 includes a substrate 119 and a dielectric layer 123. The substrate 119 is the substrate upon which the integrated circuit is formed. This view also illustrates sections of shield 102, straps 105 (the medial portions 111 of straps 105) and the gaps 103 positioned between the sections of shield 102. The sections of shield 102 are positioned in the dielectric layer 123. Also shown in this view, is the third current path region 124 (where the current path travels from 101Jb to 101Jt), which is made of a layer of metal and is separated from the shield 102 a predetermined distance by the layer of dielectric 123. Moreover, the cross-sectional view along line A_B of FIG. 2 is along the plane of symmetry. The plane of symmetry is perpendicular to the working surface 121 of the substrate 119.

Figure 2A:
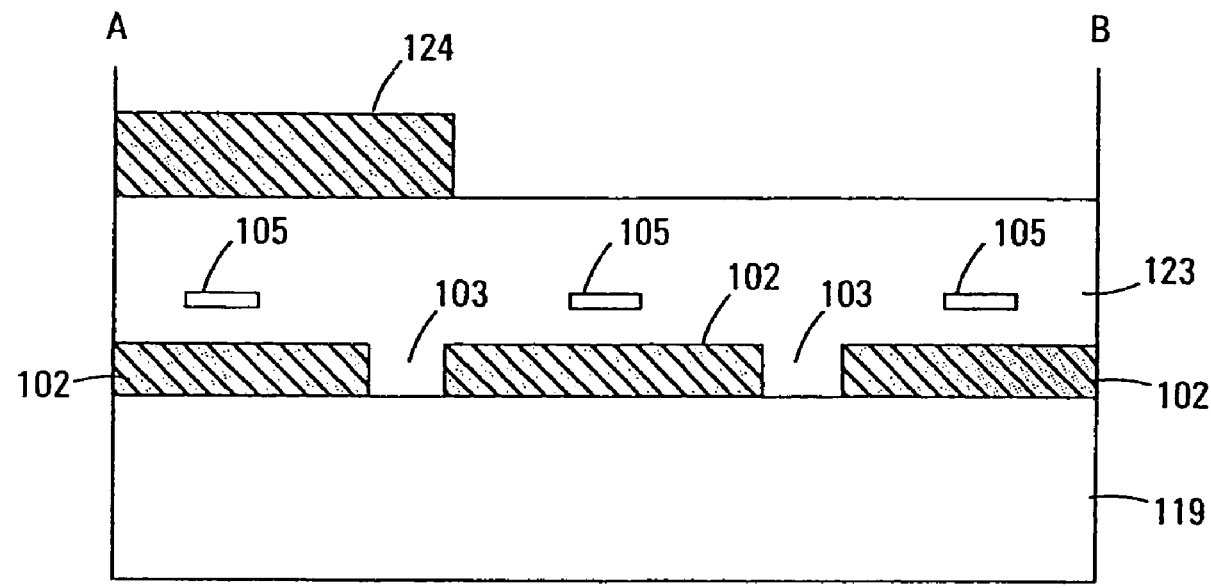
FIG. 2A is a cross-sectional cut-out view of an area defined by line A-B of a symmetric center-tapped inductor of another embodiment of the present invention.
Figure 2B:
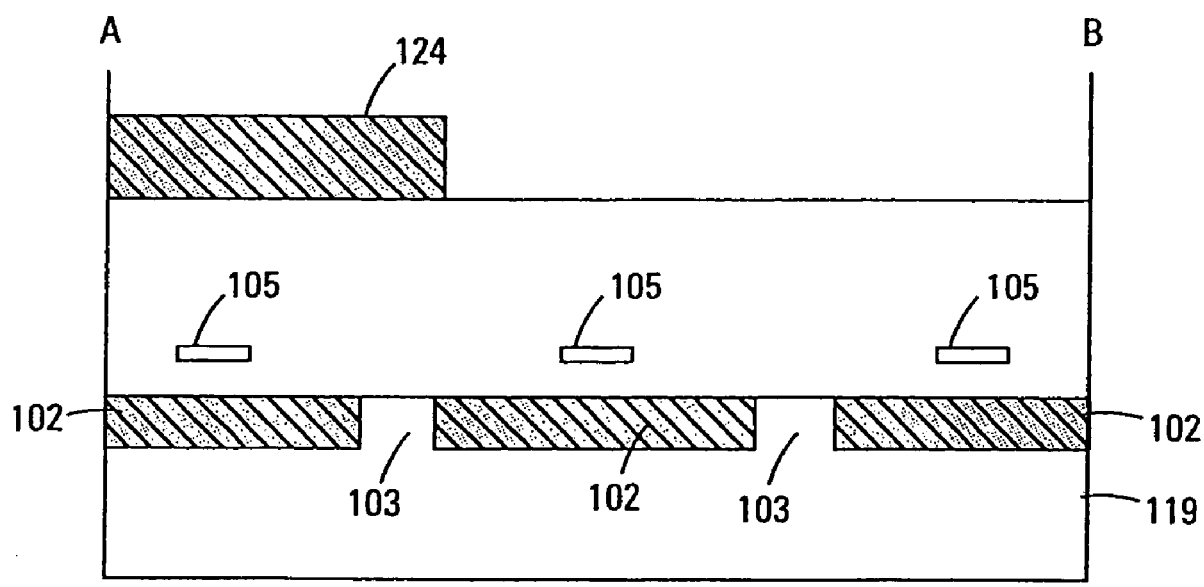
FIG. 2B is a cross-sectional cut-out view of an area defined by line A-B of a symmetric center-tapped inductor of another embodiment of the present invention.

The shield segments 102 can be positioned in different locations between the main metal layer that form the current path regions (which includes current path region 124) and a bottom surface 137 of the substrate 119. For example in the embodiment of FIG. 2, the shield segments 102 are formed in the dielectric layer 123. In another embodiment, the shield segments 102 are formed on the surface 121 of the substrate 119. This embodiment is illustrated in FIG. 2A. In yet another embodiment, the shield segments 102 are formed in the substrate 119. This embodiment is illustrated in FIG. 2B.

Figure 2C:
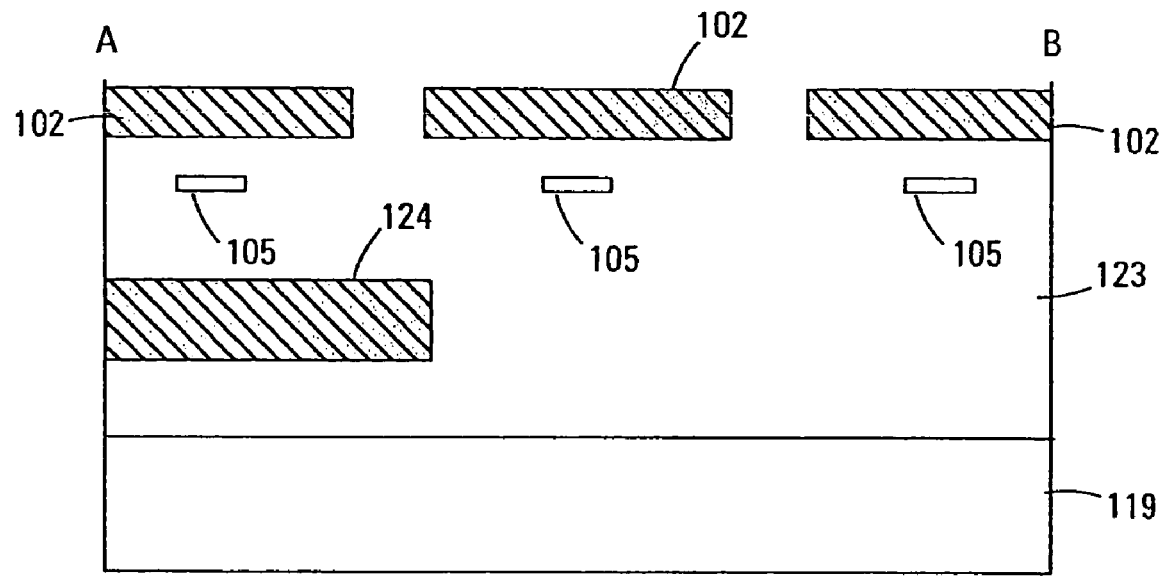
FIG. 2C is a cross-sectional cut-out view of an area defined by line A-B of a symmetric center-tapped inductor of another embodiment of the present invention.
Figure 2D:
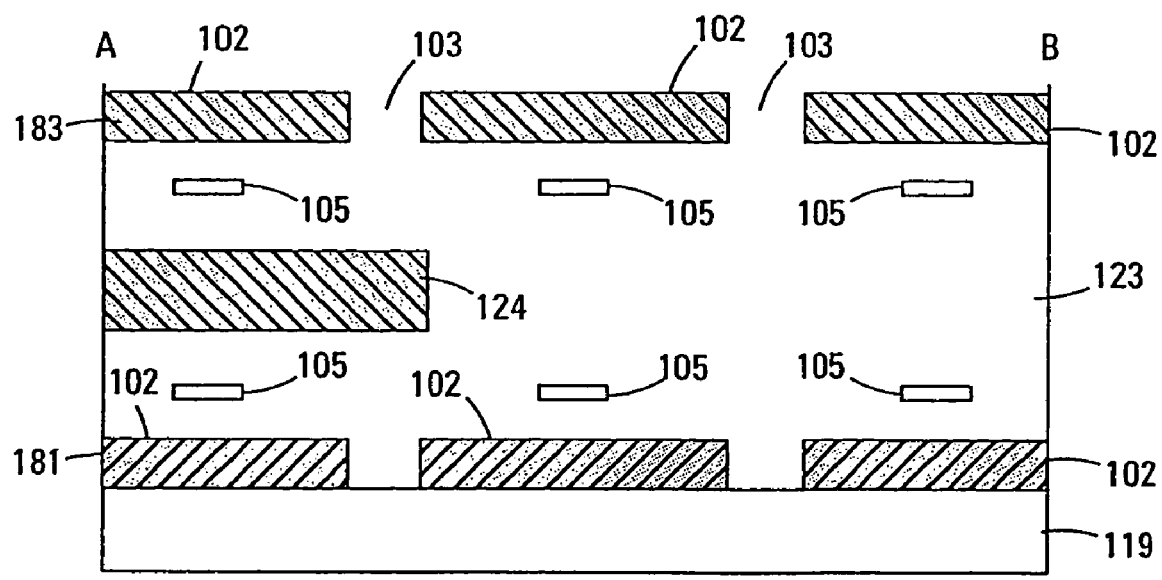
FIG. 2D is a cross-sectional cut-out view of an area defined by line A-B of a symmetric center-tapped inductor of yet another embodiment of the present invention.

Further, in one embodiment (illustrated in FIG. 2C), current path region 124 is positioned between the shield segments 102 and the substrate 119. That is, in this embodiment, the main metal layer, upon which current path region 124 is formed, is positioned between the shield segments 102 and the substrate 19. Moreover, in yet another embodiment (illustrated in FIG. 2D), current path region 124 is positioned between two shield segment 102 layers. That is, in this embodiment, the main metal layer, upon which current path region 124 is formed, is positioned between first and second shield segment layers 181 and 182 that form the shield segments 102. Also illustrated in FIG. 2D are the conductive straps 105.

Referring to FIG. 3, a cross-sectional view of line C_D is illustrated. This view illustrates how a strap 105 is coupled to a section of the shield 102. As illustrated, in this embodiment the shield 102 is formed in a dielectric layer 123. The strap 105 is also formed in the dielectric layer 123 a predetermined distance from the shield 102. In one embodiment the straps 105 are made from one or more inner metal layers. That is, metal layers that are positioned between the sections of shield and the main metal layer. In another embodiment, the straps 105 are a layer of doped material than is more conductive than the shield 102. As illustrated in FIG. 3, strap 105 is coupled to the shield 102 by contacts 126 or vias 126.

Referring to FIG. 4, a cross-sectional view of line E_F is illustrated. This view illustrates current router 128. Current router 128 includes an overpass 130 and an underpass 132. As illustrated, the first current path region 120 is coupled to an underpass 132 by contacts 134 (or vias 134). The second current path region 122 is coupled the underpass 132 by contacts 136 (or vias 136). The overpass 130 is spaced from the underpass 132 a predetermined distance by dielectric layer 123.

The use of the current router 128 can lead to a loss of symmetry in the symmetric inducting devices. However, the present invention uses a couple of techniques to minimize the loss of symmetry caused by the current router 128. A first loss of symmetry is present when the overpass 130 and underpass 132 have different resistances. This is generally due to a difference in the sheet resistance in the metal layers upon which the overpass 130 and underpass 132 are formed. Typically the top or main metal layer (the metal layer used to form the first, second third, fourth current path regions and the overpass 130) has less sheet resistance than the layer of metal used to form the underpass 132. This results in a resistance in the underpass 132 being greater that the overpass 130. In one embodiment of the present invention, the loss of symmetry due to the difference in resistance in the overpass 130 and the underpass 132 is reduced by proportionally making the underpass 132 wider and the overpass 130 narrower.

Figure 4A:
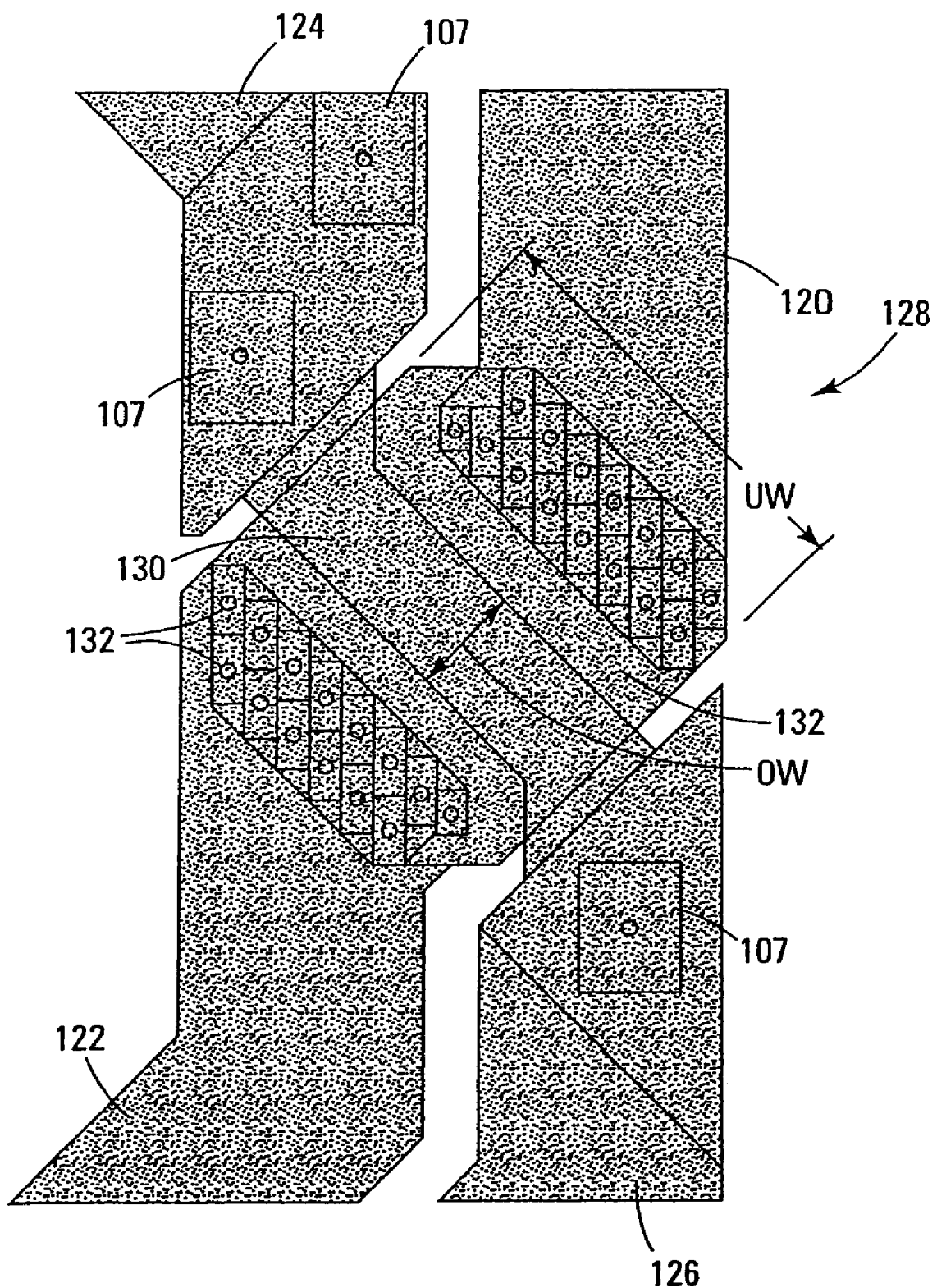
FIG. 4A is a top view of one embodiment of a current router of the present invention.

The width of the underpass 132 and the overpass 130 of current router 128 is illustrated in FIG. 4A. In particular, OW denotes the width of the overpass 130 and UW denotes the width of the underpass 132. Further illustrated in FIG. 4A, current path regions 120 and 122 are narrower than associated underpass 132 and current path regions 124 and 126 are wider than associated overpass 130 in this embodiment. In one embodiment, the width of the overpass 130 is less than half the width of associated current path regions 124 and 126. Also illustrated in FIG. 4A are contacts 136 (or vias 136) that couple current path region 122 to the underpass 132 and contacts 134 (or vias) that couple current path region 120 to underpass 132.

In another embodiment, where the metal layer used to form the underpass 132 has less sheet resistance than the metal layer used to form the overpass 130, the resulting difference in resistance in the overpass 130 and the underpass 132 is reduced by proportionally making the overpass 130 wider and the underpass 130 narrower (not shown). In yet another embodiment of a current router that has its overpass wider than an associated underpass, the width of the overpass is also wider than associated current path regions (current path regions that are coupled together by the overpass). In addition, in this embodiment, the width of the underpass is narrower than associated current path regions (current path regions coupled together by the underpass). Moreover, in one embodiment, the width of the underpass is less than half the width of associated current path regions. If, however, the sheet resistance in the overpass 130 and the underpass 132 are generally equal, the width of the overpass 130 and the underpass 132 will also be generally equal.

The underpass 132 being closer to the shield 102 than the overpass 130 causes another loss of symmetry. Because of this, the underpass 132 provides more capacitance to the shield than the overpass 130. In one embodiment, the loss of symmetry due to this added capacitance to the shield by the underpass 132 is reduced by adding additional capacitance in the path that uses the overpass 130. In particular, referring to FIG. 4A, in one embodiment the added capacitance is accomplished by coupling the respective third and fourth current path regions 124 and 126 to respective sections of metal layer 107 that are generally located at the same vertical depth as the underpass 132. These sections of metal layer 107 can be referred to as capacitor compensation sections 107. As illustrated in FIG. 4A, the capacitor compensation sections 107 are positioned approximate opposite sides of the current router 128. Moreover, as FIG. 4A illustrates one or more pairs of capacitor compensation sections 107 can be used. In addition, in this embodiment the area of the combined compensation sections 107 is approximately the area of the underpass 132 so as to achieve generally the same capacitance. Although, it may be preferred that the capacitor compensation sections 107 be formed in pairs, this does not have to be the case in all situations. In fact, in one embodiment of the present invention only one capacitor compensation section 107 is used per coupled current path regions.

In other embodiments, the capacitor compensation sections 107 are formed at a vertical depth that is not the same as the underpass 132. In these embodiments, the size of the compensation regions is adjusted to approximate the capacitance of the underpass 132. In one embodiment, the capacitor compensation sections 107 are formed in a layer that is between the underpass 132 and the shield 102. The capacitor compensation sections 107 of this embodiment will have proportionally less area than would be required if they were formed at the same level as the underpass 132. In another embodiment, the capacitor compensation sections 107 are formed in a layer between the main metal layer (the layer the current path regions are formed) and the underpass 132. In this embodiment, the capacitor compensation sections 107 will have proportionally more area than would be required if they had been formed at the same level as the underpass 132.

Figure 5A:
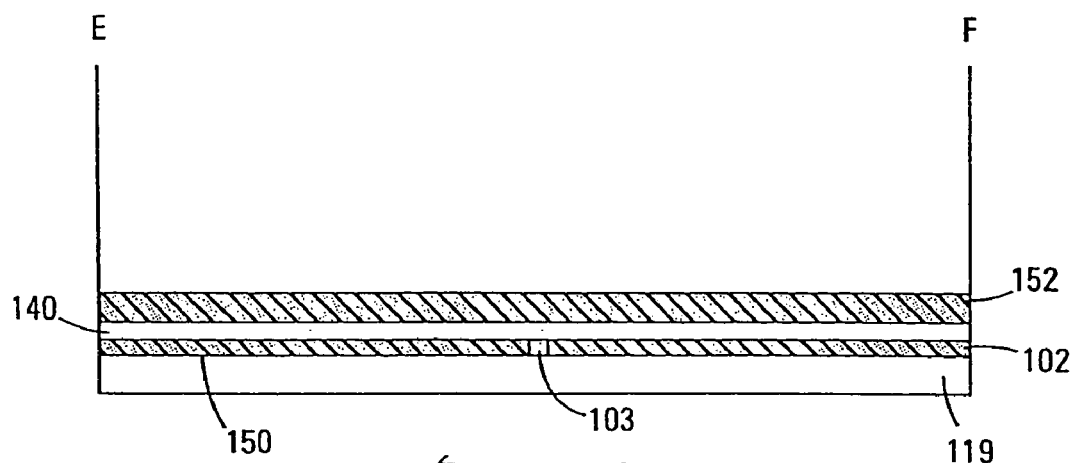
FIGS. 5A–5E are cut-out cross-sectional views illustrating the formation of the area defined by line E_F.

To better understand the formation of the present invention, FIGS. 5A–5E are provided. FIGS. 5A–5D illustrate the formation of symmetric center-tapped inductor 100 along line E_F. Referring to FIG. 5A, upon the surface 150 of the substrate 119 a shield layer is formed. The surface 150 of the substrate 119 can also be referred to as the working surface 150. As stated above, the shield layer is a layer that is more conductive than the material that surrounds it. For example, the shield layer may be a layer of metal deposited on the surface 150 of the substrate 119 or a doped layer formed in the substrate 119 by the injection of dopants through the working surface 150. The shield layer is then patterned to form the sections of shield 102. One method of patterning the shield 102 into sections is by masking the shield layer and then etching the gaps 103. A first layer of dielectric 140 is then formed overlaying the shield 102. The first layer of dielectric 140 also fills in the gaps 103. A first layer of metal 152 is then deposited overlaying the first layer of dielectric 140.

Figure 5B:
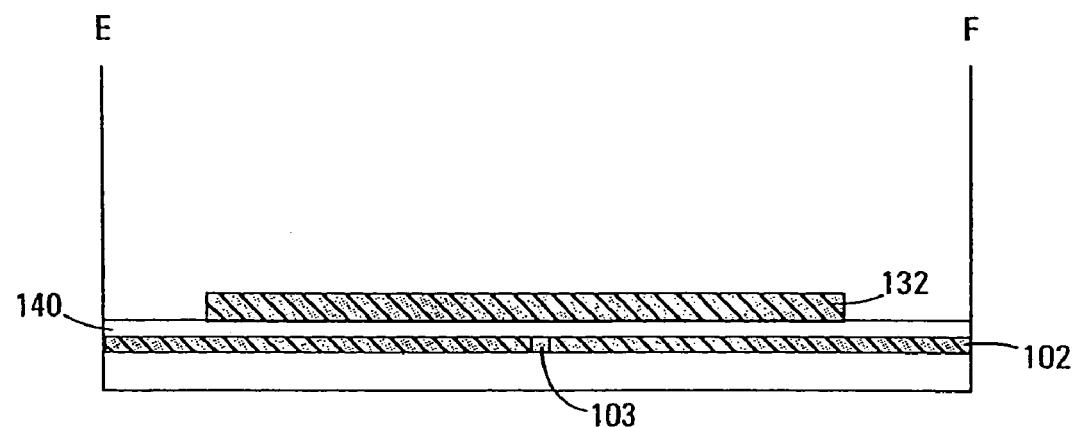
Figure 5C:
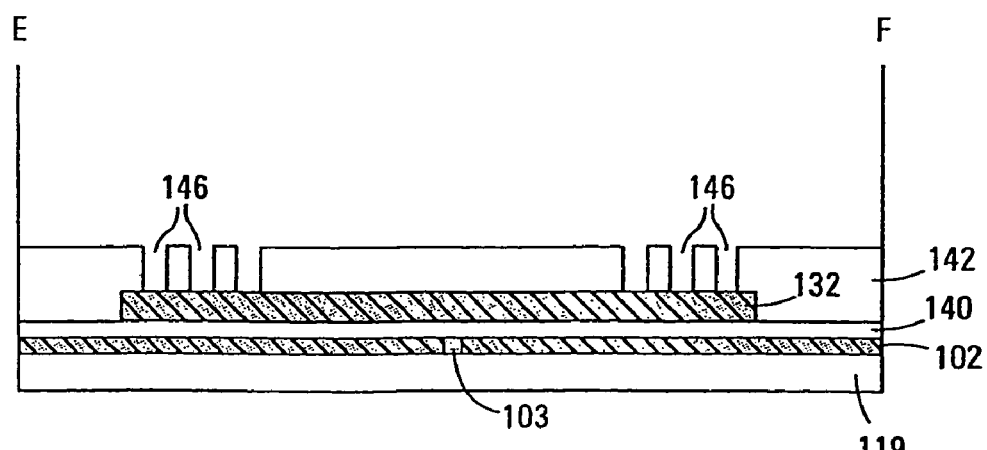
Figure 5D:
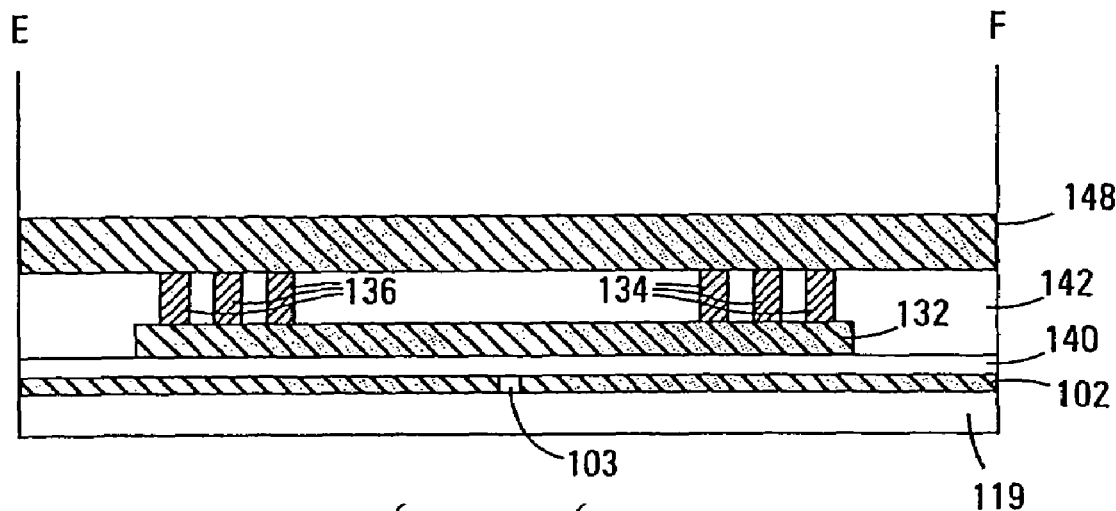

As illustrated in FIG. 5B, the first metal layer 152 is then etched using a mask to form the underpass 132. A second dielectric layer 142 is then formed overlaying the underpass 132 and first layer of dielectric 140. This is illustrated in FIG. 5C. The first and second dielectric layers 140 and 142 may be formed by a variety of methods such as thermally grown or deposited. Moreover, the first and second dielectric layers 140 and 142 are represented by dielectric layer 123 of FIG. 4. Referring back to FIG. 5C, the second dielectric layer 142 is then masked and etched to form vias 146. Contacts 134 and 136 are then formed in the vias, as illustrated in FIG. 5D. One method of forming the contacts 134 and 136 in the vias is by the dual Damascene process. A second metal layer 148 is deposited at the same time the contacts 134 and 136 are formed.

Figure 5E:
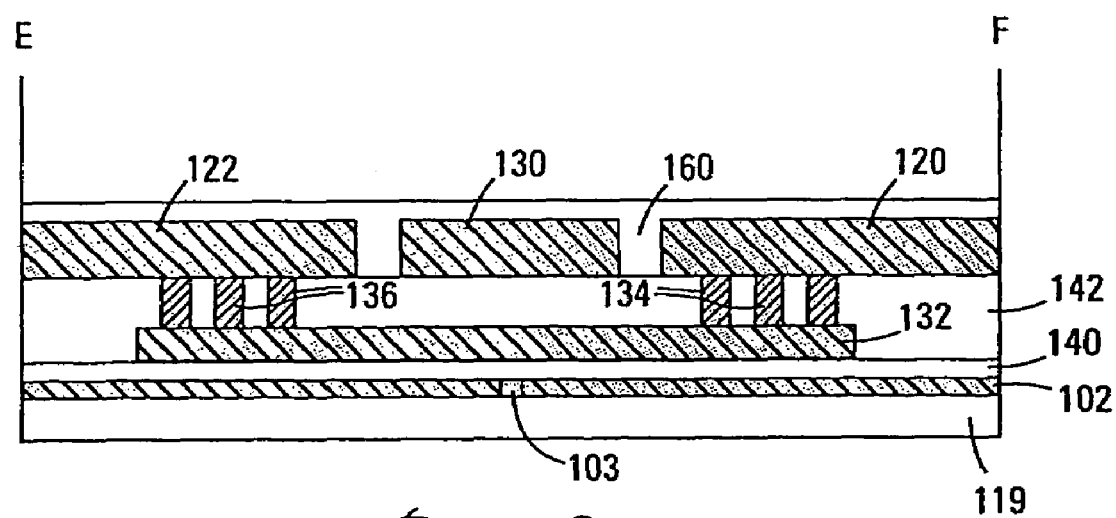

Referring to FIG. 5E, the second metal layer 148 is then masked and etched to form the first and second current path regions 120 and 122 and the overpass 130. As illustrated, contacts 136 couple the second current path region 122 to the underpass 132 and contacts 134 couple the first current path region 120 to the underpass 132. FIG. 5E also illustrates that a sealing layer of passivation 160 is typically then formed to protect the circuit. The passivation layer 160 overlays all the circuits formed in the integrated circuit. Although the layers of metal and dielectric have been described as being patterned by a mask and etch technique, it will be understood in the art that other patterning techniques could be used to achieve similar results and that the present invention is not limited to mask and etch techniques.

Figure 6:
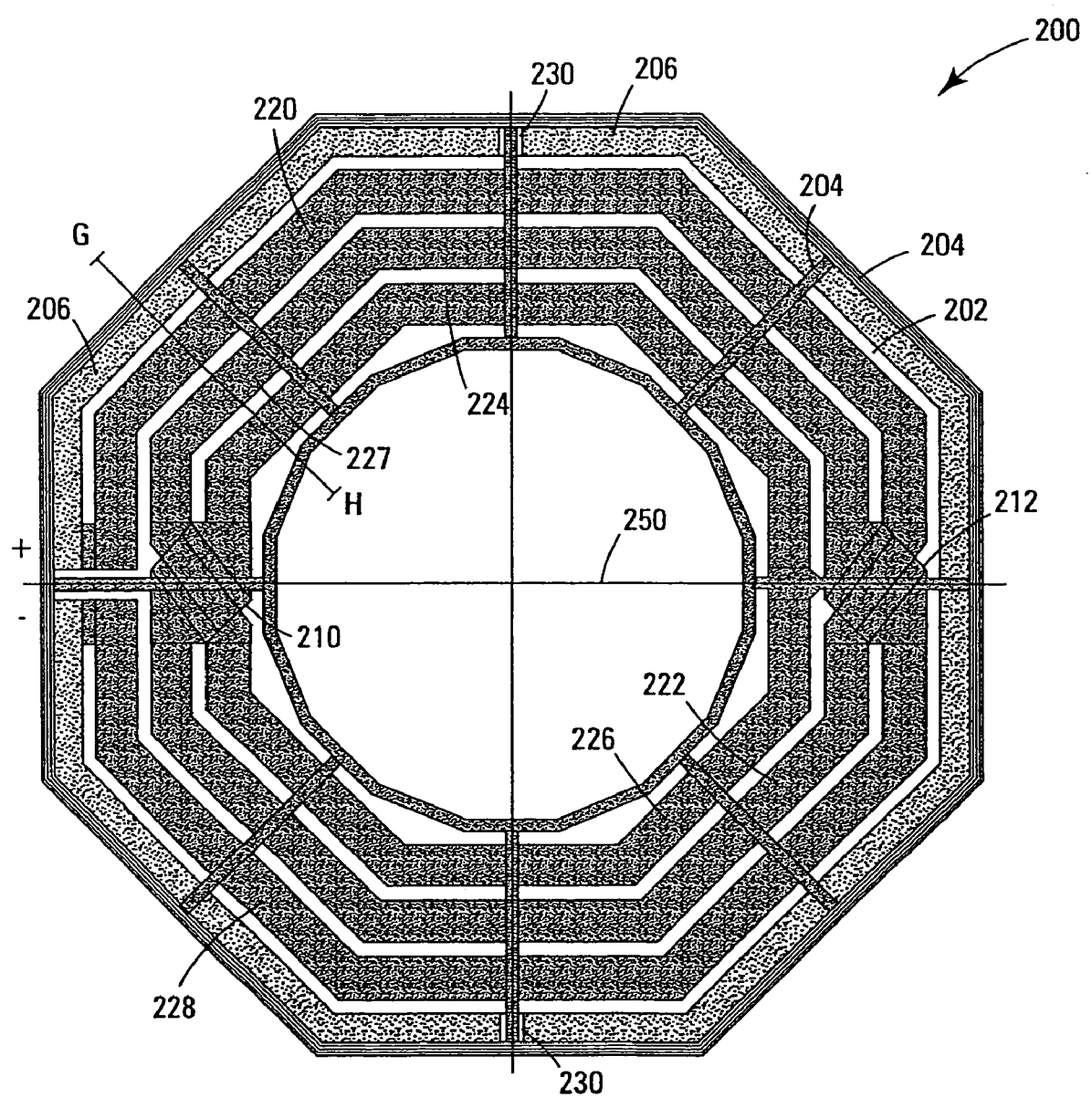
FIG. 6 is a top view of a symmetric center-tapped inductor of another embodiment of the present invention.

Moreover, although FIG. 1 illustrates an embodiment of the present invention as being in the shape of an octagon, embodiments of the present invention could have many different (approximately) regular polygonal shapes, such as a square or circle, and the present invention is not limited to the shape of an octagon. In addition, embodiments of the present invention can have more than two rings of current path regions 120, 122, 124 and 126. In fact, an embodiment of a symmetric center-tapped inductor 200 having more than two rings of current path regions is illustrated in FIG. 6. As illustrated in FIG. 6, in this embodiment two current routers 210 and 212 are used to direct current around the rings of current path regions 220, 222, 224, 226, 227 and 228. The current path regions 220, 222, 224, 226, 227 and 228 and the current routers 210 and 212 are formed as describe above with regard to symmetric center-tapped inductor 100 of FIG. 1.

FIG. 6 also illustrates an alternative embodiment of a shield layer 202. In this embodiment, the shield 202 is a doped layer in the semiconductor and is patterned by trenches 204 to form sections of shield 202. A capacitive charge created by a current in one of the current path regions 220, 222, 224, 226, 227 and 228 is intercepted by an associated section of the shield 202. The respective section of shield 202 then generally radially directs the charge to a metal halo 206 that is positioned to encircle an outer perimeter of the symmetric center-tapped inductor 200. The halo 206 is coupled to each segment of shield 202 to receive the charge.

Figure 7:
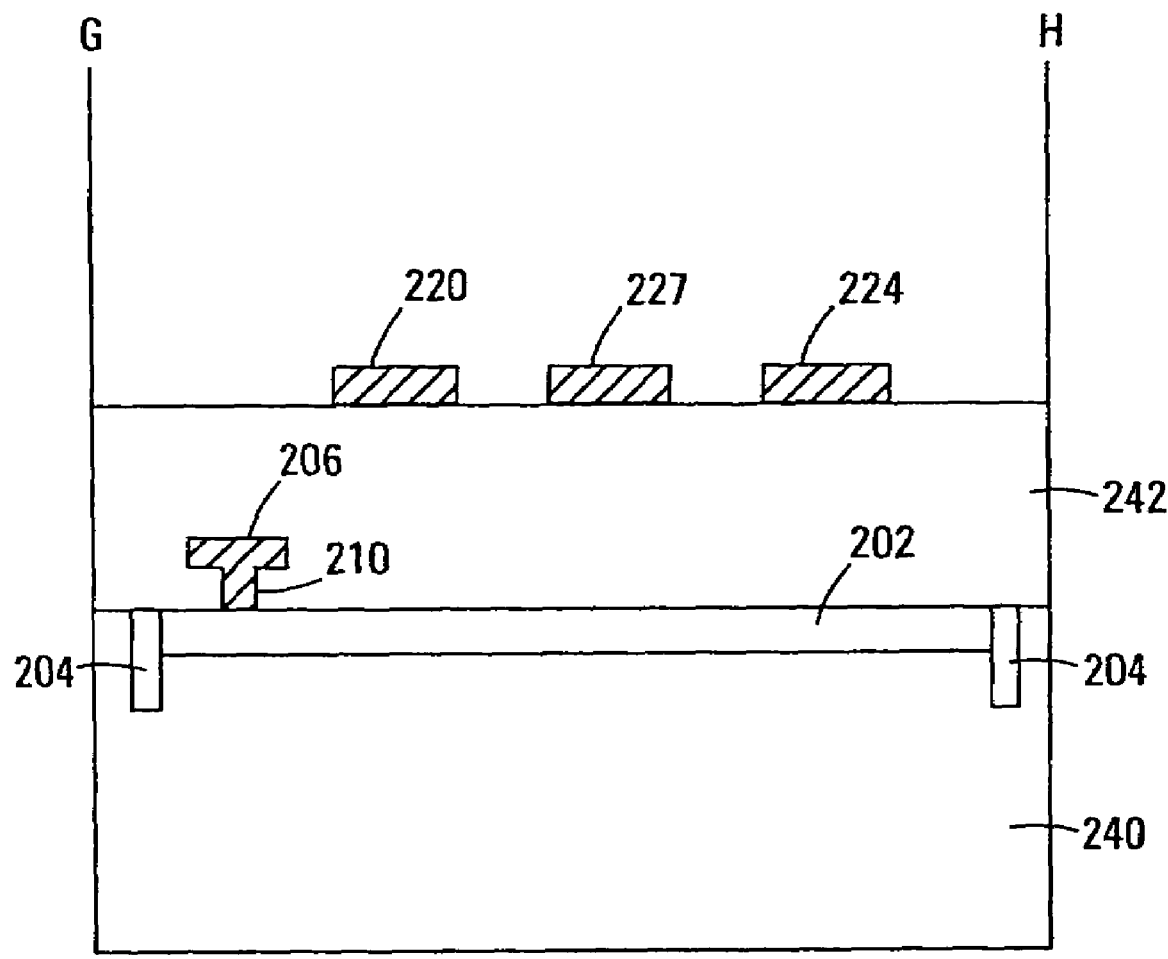
FIG. 7 is a cut-out view of a cross-sectional area defined by line G_H of a symmetric center-tapped inductor of one embodiment of the present invention.

Referring to FIG. 7, a cross sectional view at line G_H of FIG. 6 is illustrated. Implanting dopants into the substrate 240 to create a conductive layer that is more conductive than adjacent layers forms the shield 202, of this embodiment. As illustrated, trenches 204 are then etched and filled with insulating material in the substrate 240. The trenches 204 are used to separate the shield 202 into regions. The halo 206 is coupled to the shield 202 by contact 210. The halo 206, the contact 210, the shield 202, and the trenches 204 are overlayed by dielectric layer 242. Current path regions 220, 227 and 224 are deposited to overlay the dielectric layer 242.

Figure 8:
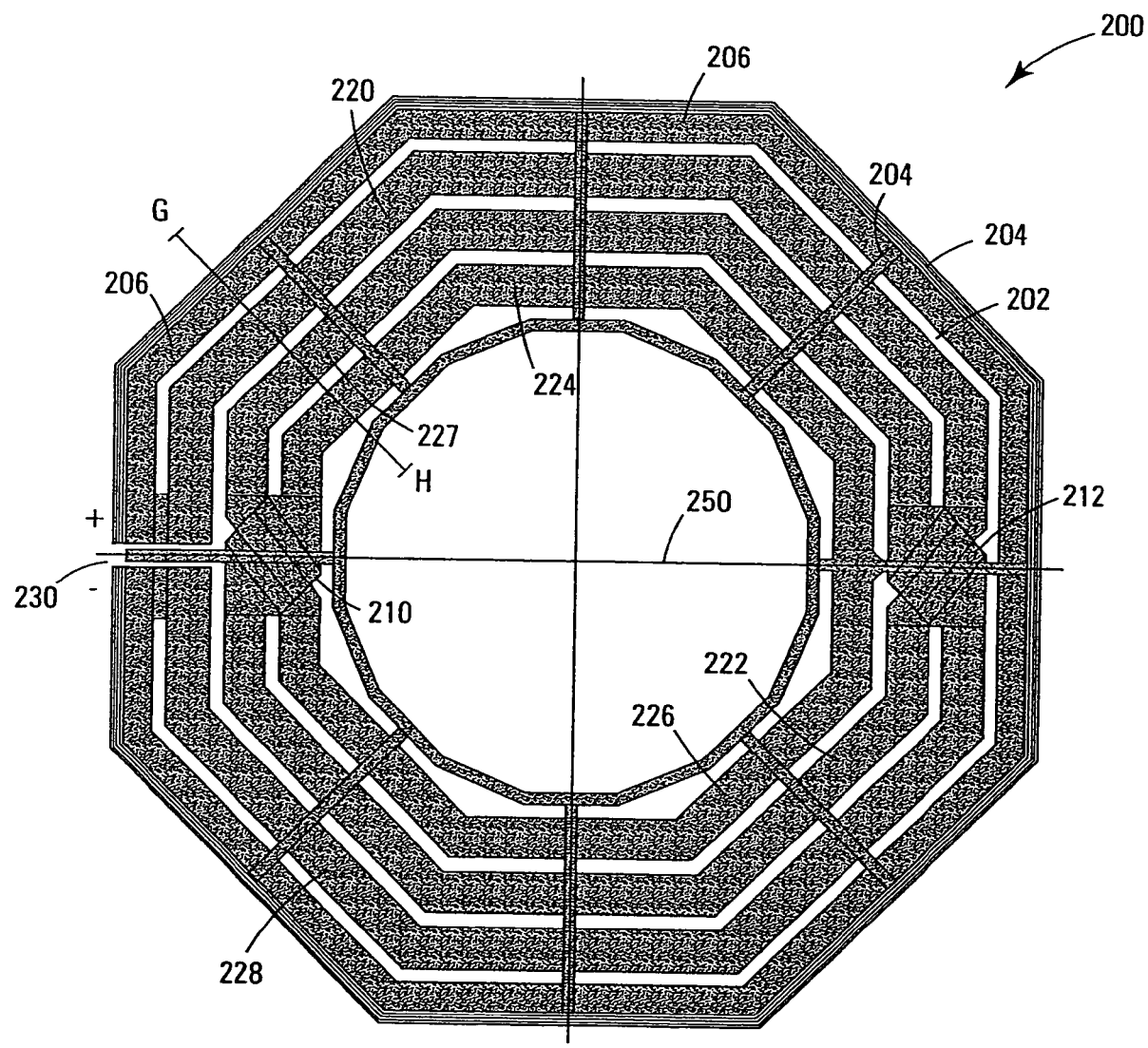
FIG. 8 is a top view of a symmetric center-tapped inductor of another embodiment of the present invention.

In the embodiment illustrated in FIG. 6, the halo 206 is formed having two gaps 230. These gaps 230 are positioned so each segment of halo 206 is symmetric about the plane of symmetry 250. When a charge enters a portion of the halo 202 it moves in the halo 202 to a position opposite the plane of symmetry 250 where it is pulled up out of the halo 206 as similarly describe above for symmetric center-tapped inductor 100. In this embodiment, the shield 202 and the halo 206 are not coupled to an external AC ground. In another embodiment that has its shield and halo coupled to an external AC ground, only one gap 230 is formed in the halo 206 and the gap 230 is located at the line of symmetry 250. This embodiment is illustrated in FIG. 8. In another embodiment, a combination of the gaps in the halos illustrated in FIGS. 6 and 8 are implemented. In this embodiment, the halo has a first gap positioned at the plane of symmetry, a second gap positioned on a first side of the plane of symmetry and a third gap positioned on a second side of the plane of symmetry. Moreover, in this embodiment, the second and third gaps are symmetric with respect to each other about the plane of symmetry.

Figure 9:
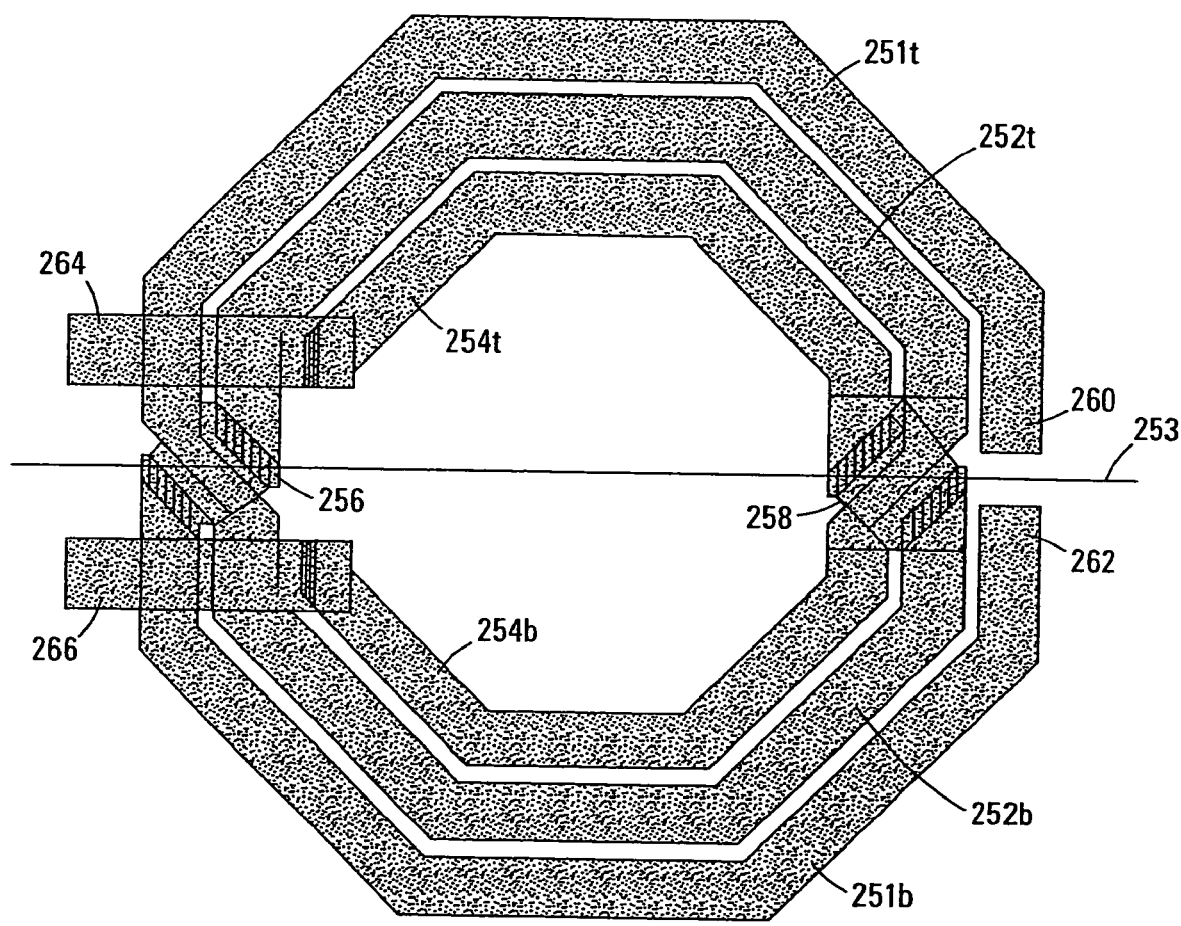
FIG. 9 is a top view of one embodiment of current path regions having four leads of the present invention.

Another embodiment of current path regions 251t, 251b, 252t, 252b, 254t and 254b of a symmetric inducting device is illustrated in FIG. 9. In this embodiment, three pairs of current path regions 251(t and b), 252(t and b) and 254(t and b) are formed in a generally regular polygonal shape, which in this case is an octagon. Each pair of current path regions 251(t and b), 252(t and b) and 254(t and b) is generally symmetric about a plane of symmetry denoted by line 253 in FIG. 9. This embodiment includes a first and second current routers 256 and 258 to selectively coupled current between current path regions 251, 252 and 254. Current routers 256 and 258 of this embodiment have underpasses that are wider than the overpasses to achieve similar resistance paths through the overpasses and the underpasses. This embodiment also includes first (positive) and second (negative) leads 260 and 262 to couple an external AC voltage across. Also included in this embodiment, is third and fourth leads 264 and 266 which are coupled on opposite sides of the plane of symmetry 253 to current path region 254 which supplies additional leads for circuit designs.

Figure 10:
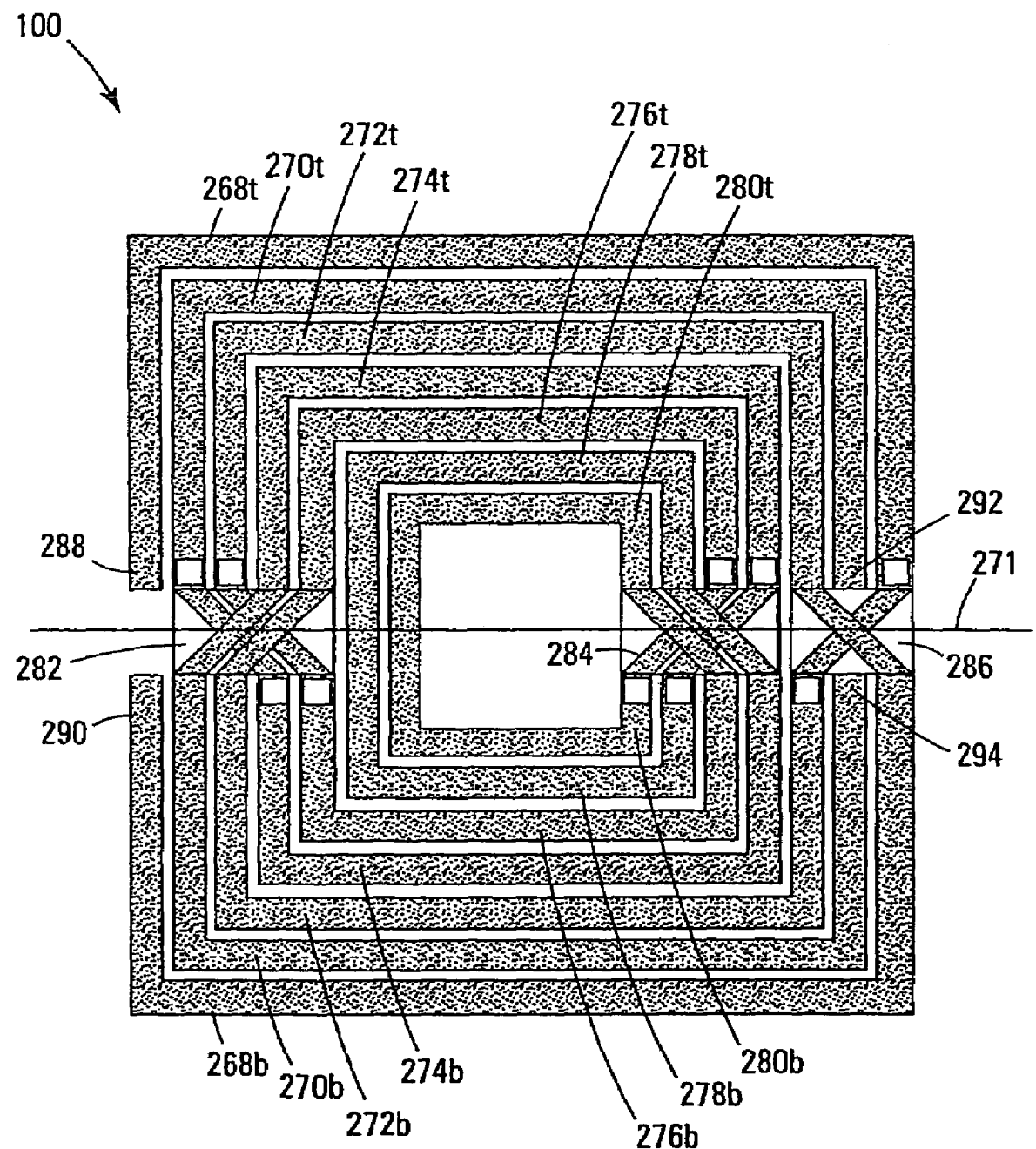
FIG. 10 is a top view of one embodiment of the current path regions in a square shape of the present invention.

Yet another example of an embodiment of pairs of current path regions 268(t and b), 270(t and b), 272(t and b), 274(t and b), 276(t and b), 278(t and b) and 280(t and b) of the present invention is illustrated in FIG. 10. In this embodiment, each pair of current path regions 268(t and b), 270(t and b), 272(t and b) 274(t and b), 276(t and b), 278(t and b) and 280(t and b) form a generally regular polygonal shape, which in this case is a square. Each pair is generally symmetric about a plane of symmetry denote by line 271 of FIG. 10. This embodiment has first and second current routers 282 and 284 that are formed with two overpasses and two underpasses as illustrated in FIG. 10. With the current routers 282 and 284, single current routers of embodiments of the present invention are doubled up to form the double current routers 282 and 284. For example, double current router 282 couples current path region 270t to current path region 274b and current path region 272t to current path region 276b. In the embodiment shown in FIG. 10 the underpasses of current routers 282 and 284 are wider than the overpasses to achieve similar resistance paths through the overpasses and the underpasses. Also included is current router 286 that has a single overpass and a single underpass. Moreover, this embodiment includes first and second leads 288 and 290 and third and fourth leads 292 and 294. The first and second leads 288 and 290 are coupled on opposite sides of the plane of symmetry 271 to current path region pair 268. The third and fourth leads 292 and 294 are coupled on opposite sides of the plane of symmetry 271 to current path region 270.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A current router for an inducting device in an integrated circuit comprising:
   one or more overpasses to electrically connect select current path regions of the inducting device, the one or more overpasses are made from a conductive layer having a first sheet resistance, each overpass having a first width; and
   one or more underpasses to electrically connect different select current path regions of the inducting device, the one or more underpasses are made from a conducting layer having a second different sheet resistance, each underpass having a second different width, wherein the first width of each overpass and the second different width of an associated underpass are adjusted to make the resistance through the overpass approximately equal to the resistance through the associated underpass.

2. The current router for an inducting device in an integrated circuit of claim 1, wherein at least one of the one or more underpasses has less than half the width of associated current path regions.

3. The current router for an inducting device in an integrated circuit of claim 1, where at least one of the one or more underpasses has less than half the width of associated current path regions.

4. The current router for an inducting device in an integrated circuit of claim 1, wherein the one or more overpasses are wider than the one or more underpasses.

5. The current router for an inducting device in an integrated circuit of claim 4, wherein the one or more overpasses are wider than associated current path regions.

6. The current router for an inducting device in an integrated circuit of claim 4, wherein the one or more underpasses are narrower than associated current path regions.

7. The current router for an inducting device in an integrated circuit of claim 1, wherein the one or more overpasses are made narrower than the one or more underpasses.

8. The current router for an inducting device in an integrated circuit of claim 7, wherein the one or more overpasses are narrower than associated current path regions.

9. The current router for an integrated circuit of claim 8, wherein the one or more underpasses are wider than associated current path regions.

* * * * *